United States Patent
Fahland et al.

(10) Patent No.: US 10,907,249 B2
(45) Date of Patent: Feb. 2, 2021

(54) METHOD FOR COATING A FLEXIBLE SUBSTRATE PROVIDED WITH A PROTECTIVE FILM

(71) Applicant: Fraunhofer-Gesellschaft zur Förderung der angewandten Forschung e.V., Munich (DE)

(72) Inventors: Matthias Fahland, Dresden (DE); Uwe Meyer, Arnsdorf (DE); Tobias Vogt, Dresden (DE); Steffen Günther, Dresden (DE); John Fahlteich, Dresden (DE); Nicole Prager, Grumbach (DE)

(73) Assignee: FRAUNHOFER-GESELLSCHAFT ZUR FÖRDERUNG DER ANGEWANDTEN FORSCHUNG E.V., Munich (DE)

( * ) Notice: Subject to any disclaimer, the term of this patent is extended or adjusted under 35 U.S.C. 154(b) by 51 days.

(21) Appl. No.: 16/308,243

(22) PCT Filed: Jun. 8, 2017

(86) PCT No.: PCT/EP2017/064030
§ 371 (c)(1),
(2) Date: Dec. 7, 2018

(87) PCT Pub. No.: WO2017/211989
PCT Pub. Date: Dec. 14, 2017

(65) Prior Publication Data
US 2019/0256971 A1    Aug. 22, 2019

(30) Foreign Application Priority Data

Jun. 10, 2016   (DE) .......... 10 2016 110 737

(51) Int. Cl.
*B32B 41/00*    (2006.01)
*C23C 14/56*    (2006.01)
*C23C 16/54*    (2006.01)

(52) U.S. Cl.
CPC .......... *C23C 14/562* (2013.01); *C23C 16/545* (2013.01)

(58) Field of Classification Search
CPC ..................... C23C 14/562; C23C 16/545
(Continued)

(56) References Cited

U.S. PATENT DOCUMENTS 6,250,580 B1 * 6/2001 Madrzak ............... B65H 18/26
                                                                   242/533.2
2011/0091662 A1   4/2011 Fahland et al.

FOREIGN PATENT DOCUMENTS

DE    10 2008 028 542 A1    12/2009
EP         2228463 B1         2/2010
(Continued)

OTHER PUBLICATIONS

International Search Report, issued in International Application No. PCT/EP2017/064030, dated Sep. 27, 2017, pp. 1-3, European Patent Office, Rijswijk, Netherlands.

*Primary Examiner* — Michael N Orlando
*Assistant Examiner* — Joshel Rivera
(74) *Attorney, Agent, or Firm* — Brinks Gilson & Lione

(57) ABSTRACT

Methods and apparatuses for coating a flexible substrate are provided. The flexible substrate is guided over a process roller. The flexible substrate has a first protective film, which is removed from the flexible substrate before the flexible substrate reaches a coating zone of a coating device located opposite the process roller. The first protective film is removed from the flexible substrate after the flexible substrate has formed a mechanical contact with the surface of (Continued)

the process roller. A second protective film is applied to the coated side of the flexible substrate after the flexible substrate has left the coating zone of the coating device and before the mechanical contact between the process roller and the flexible substrate is ended.

4 Claims, 1 Drawing Sheet

(58) Field of Classification Search
USPC .......................... 156/64, 350, 351, 378, 379
See application file for complete search history.

(56) References Cited

FOREIGN PATENT DOCUMENTS

| | | | |
|---|---|---|---|
| EP | 2883822 | A1 | 6/2015 |
| JP | 2012-177179 | A | 9/2012 |
| JP | 2014-74221 | A | 4/2014 |
| WO | WO 2015/010036 | A1 | 1/2015 |
| WO | WO 2015/198701 | A1 | 12/2015 |

* cited by examiner

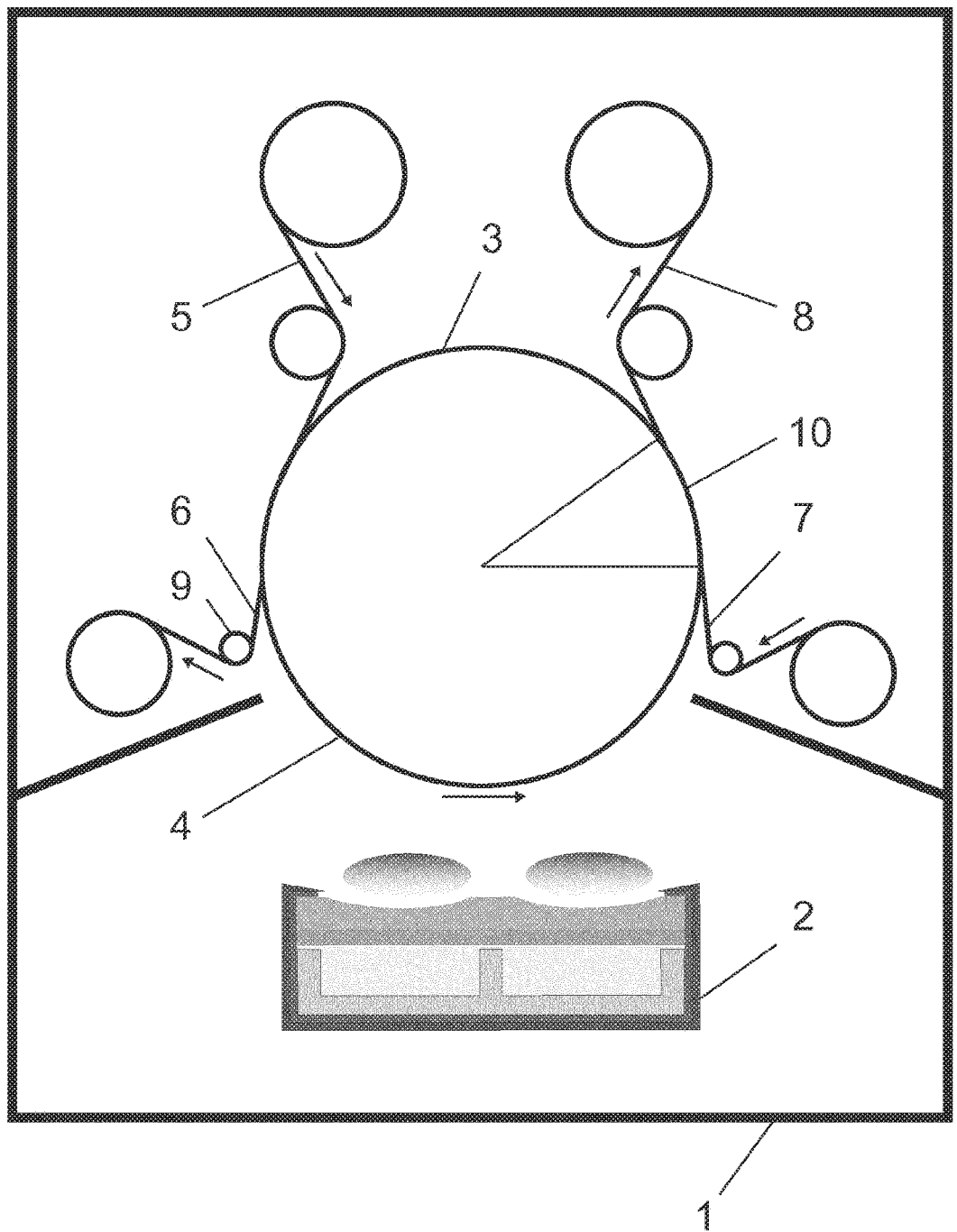

METHOD FOR COATING A FLEXIBLE SUBSTRATE PROVIDED WITH A PROTECTIVE FILM

CROSS-REFERENCE TO RELATED APPLICATIONS

This application is a 371 nationalization of international patent application PCT/EP2017/064030 filed Jun. 8, 2018, which claims priority under 35 USC § 119 to German patent application DE 10 2016 110 737.9 filed Jun. 10, 2016. The entire contents of each of the above-identified applications are hereby incorporated by reference.

TECHNICAL FIELD

The invention relates to a method for the coating of a flexible substrate, wherein the flexible substrate has a protective film that is removed before the coating.

BRIEF DESCRIPTION OF THE DRAWINGS

FIG. 1 a schematic view of a configuration for performing the inventive method.

DETAILED DESCRIPTION

Various methods and configurations for the coating of flexible substrates are known, in which the flexible substrates partially wrap around a process cylinder during the coating. Hereinafter, process cylinders are understood to mean those rollers over which flexible substrates are guided during the coating process in order to set the substrate temperature to a temperature that is advantageous for the coating. In many applications, such process rollers are formed as chill rolls. For example, DE 10 2008 028 542 A1 discloses methods in which a flexible substrate is guided over a chill roll, while a layer is deposited on the flexible substrate by way of a sputtering magnetron.

In some applications, there are high demands with respect to the degree of purity of the surface of a flexible substrate to be coated, in order to ensure the functionality of the layer deposited thereupon. It is therefore also known that the surface of a flexible substrate to be coated can be equipped with a protective film, which protects the surface to be coated against soiling and damage, wherein the protective film is not removed from the flexible substrate until it is in a coating device.

EP 2 228 463 A discloses a method in which a flexible substrate is equipped with a protective film in a first coating device on the coated side after a first coating procedure and then wound. In the winding chamber of a second coating device, the protective film is removed again, and the flexible substrate is guided over multiple deflection rollers until it partially wraps around a chill roll. There, the flexible substrate is subjected to a second coating procedure and, after being guided over multiple deflection rollers, finally wound again. Here, it has a disadvantageous effect that the side of the flexible substrate to be coated can reach the chill roll with various deflection rollers before the second coating procedure, which can lead to impurities and/or damages to the surface of the substrate to be coated or the layer deposited thereupon.

The invention is therefore based upon the technical challenge of creating a method for the coating of a flexible substrate equipped with a protective film, whereby the disadvantages of the prior art can be overcome. In particular, it should also be possible with the inventive method to remove a protective film with a constant angle from the flexible substrate and thereby deposit layers with very good and homogeneous layer properties.

In the inventive method, a flexible substrate is guided over a process roller for coating, wherein the flexible substrate has a first protective film, which is removed from the flexible substrate before the flexible substrate reaches the coating zone of a coating device located opposite the process roller. The coating device can be formed, for example, as a sputtering magnetron or as a vaporizing device. However, according to the invention, the first protective film is not removed from the substrate until after the flexible substrate has formed a mechanical contact with the process roller surface.

Further, a second protective film is applied to the coated side of the flexible substrate after the flexible substrate has left the coating zone of the coating device and before the mechanical contact between the process roller surface and the flexible substrate is ended.

The present invention is explained in greater detail below with reference to exemplary embodiments.

FIG. 1 schematically shows a configuration whereby the inventive method can be performed. The configuration comprises an operating chamber 1, within which a coating device 2 formed as a sputtering magnetron and a process roller 3 located opposite the coating device 2 are arranged, wherein the process roller 3 rotates in a counter-clockwise direction. Using the coating device 2, a layer is deposited onto one side of a flexible substrate 4. In the inventive method, one or more layers can be deposited on the side of the flexible substrate 4 to be coated.

First, a compound 5 consisting of the flexible substrate 4 and a first protective film 6 is wound by a roller and guided over one or more deflection rollers such that the flexible substrate 4 partially wraps around the process roller 3. According to the invention, the first protective film 6 is not removed from the flexible substrate 4 until the flexible substrate 4 has formed a mechanical contact with the process roller 3.

After the first protective film 6 has been removed from the flexible substrate 4, the flexible substrate 4, touching the process roller 3, is guided through the coating zone of the coating device 2, and a layer is deposited on the flexible substrate 4.

After the flexible substrate 4 has crossed through the coating zone of the coating device 2 and before the end of the mechanical contact between the flexible substrate 4 and the process roller 3, a second protective film 7 is applied to the coated side of the flexible substrate 4, and the subsequently formed compound 8 consisting of the flexible substrate 4 and the second protective film 7 is wound on a roller. In order to form a good bonding between the coated flexible substrate 4 and the second protective film 7, it is advantageous if the second protective film 7 is applied to the flexible substrate 4 such that, with the compound 8 of the coated flexible substrate 4 and second protective film 7, a mechanical contact with the process roller surface is formed, still in an angular sector 10 of the cross-section of the process roller 3 of at least 10°.

The removal of the first protective film 6 from the flexible substrate 4 on the process roller 3 before the coating process and the application of the second protective film 8 on the coated side of the flexible substrate 4 after the coating process are each critical steps for the quality of the deposited layer.

If a protective film is removed from a ribbon-shaped flexible substrate over the length of the ribbon-shaped flexible substrate with a changing angle between the flexible substrate and the protective film, this can lead to a non-homogeneous surface consistency of the flexible substrate, which can have negative effects on the quality of the subsequently deposited layer. It is therefore advantageous to perform the removal of the first protective film 6 from the flexible substrate 4 at a constant angle in order to minimize possible tolerances of the coating quality. This is made difficult by the fact that the bonding between the flexible substrate 4 and the first protective film 6 may vary over the length of the flexible substrate 4. For this reason, in the inventive method, the first protective film 6 is not removed from the flexible substrate 4 until the flexible substrate has formed a mechanical contact with the process roller. In this way, it is ensured that the flexible substrate 4 guided over the process roller with contact pressure has a constant position in space over the length of the flexible substrate 4 at the time of the removal of the first protective film. In order to fix the first protective film 6 during the procedure of removal from the flexible substrate 4, the first protective film is guided over a permanently installed guide roller 9, which ensures that the force exerted for the removal of the first protective film 6 from the flexible substrate 4 is always constant.

According to the invention, the guide roller 9 is distanced from the process roller 3 by 0.5 mm to 5 mm and therefore exerts no pressure on the substrate 4, which could otherwise lead to damage to the substrate surface. Further, this guide roller 9 is dimensioned with respect to the roller diameter such that the free-swinging dimension of the protective film 6 removed from the substrate 4 has a length of 5 mm to 50 mm. Here, the free-swinging dimension is the distance between the point at which the protective film is detached from the substrate 4 and the point at which the protective film 6 first touches the guide roller 9. According to the invention, the free-swinging dimension is therefore set to not greater than 50 mm, because a greater free-swinging dimension favors electric discharges between the detached protective film 6 and the substrate 4, which can similarly lead to damage to the substrate surface.

However, the path of movement of the first protective film 6 directly after the removal of the flexible substrate 4 does not correspond to the common tangent between the guide roller 9 and the process roller 3. Rather, an angle between the first protective film 6 and the process roller 3 is formed, which is the result of the band tension acting upon the first protective film 6. It is advantageous for the quality of the subsequently deposited layer if the band tension acting on the first protective film 6 during the removal procedure is held constant. In one embodiment, this is realized in that the guide roller 9 is formed as a pressure gauge roller. Pressure gauge rollers are known. If the guide roller 9 is formed as a pressure gauge roller, then an actual value is determined for the pressure exerted by the first protective film 6 guided over the guide roller 9. The pressure exerted on the guide roller is simultaneously a physical quantity, which characterizes the band tension of the first protective film upon removal from the flexible substrate 4. The determined actual value of the pressure is compared to a target value, and the torque of the guide roller 9 is regulated based on the comparison value. In this way, the pressure acting upon the guide roller 9, and thus simultaneously the band tension of the first protective film 6 during the removal from the flexible substrate 4, and consequentially also the angle between the first protective film 6 and the process roller 3, can be held constant.

In the inventive method, the side of a flexible substrate to be coated is not subjected to any direct mechanical contact through system components such as deflection rollers before, during and after the coating procedure. Therefore, due to the inventive method, there is no risk of damage to the surface of a substrate to be coated or to the deposited layer by way of direct mechanical contact with system components. Further, the time window within which the side of the flexible substrate to be coated is not covered by a protective film is limited to the coating procedure itself and is thus negligible. The risk of impurity of the surface of the flexible substrate to be coated and the layer deposited thereupon is also therefore strongly reduced. With the inventive method, it is therefore possible to deposit layers with very good and homogeneous layer properties.

To clarify the use of and to hereby provide notice to the public, the phrases "at least one of <A>, <B>, . . . and <N>" or "at least one of <A>, <B>, <N>, or combinations thereof" or "<A>, <B>, . . . and/or <N>" are defined by the Applicant in the broadest sense, superseding any other implied definitions hereinbefore or hereinafter unless expressly asserted by the Applicant to the contrary, to mean one or more elements selected from the group comprising A, B, . . . and N. In other words, the phrases mean any combination of one or more of the elements A, B, . . . or N including any one element alone or the one element in combination with one or more of the other elements which may also include, in combination, additional elements not listed. Unless otherwise indicated or the context suggests otherwise, as used herein, "a" or "an" means "at least one" or "one or more."

The invention claimed is:

1. A method for coating a flexible substrate, the method comprising:
   guiding the flexible substrate over a process roller, wherein the flexible substrate has a first protective film;
   removing the first protective film from the flexible substrate by way of a guide roller after the flexible substrate has formed a mechanical contact with the surface of the process roller, wherein the first protective film is removed from the flexible substrate before the flexible substrate reaches a coating zone of a coating device located opposite the process roller;
   distancing the guide roller from the process roller by a distance in a range of 0.5 mm to 5 mm,
   a free-swinging dimension of the protective film removed from the substrate between the process roller and the guide roller has a length of 5 mm to 50 mm; and
   applying a second protective film to the coated side of the flexible substrate after the flexible substrate has left the coating zone of the coating device and before the mechanical contact between the process roller and the flexible substrate is ended.

2. The method of claim 1, wherein the second protective film is applied to the coated side of the flexible substrate such that, with the compound of the coated flexible substrate and second protective film, a mechanical contact with the surface of the process roller is formed, still in an angular sector of the process roller of at least 10°.

3. The method of claim 1, wherein an actual value of the pressure acting upon the guide roller is detected and compared to a target value, and torque of the guide roller is regulated based on the comparison result.

4. The method of claim 3, wherein the guide roller comprises a pressure gauge roller.

* * * * *